US009460636B2

(12) United States Patent
Fu et al.

(10) Patent No.: US 9,460,636 B2
(45) Date of Patent: Oct. 4, 2016

(54) POWER FREQUENCY PARAMETER SIMULATION SYSTEM FOR A POWER TRANSMISSION LINE AND CONTROL METHOD THEREOF

(75) Inventors: Zhong Fu, Hefei (CN); Jiantao Ye, Hefei (CN); Daowen Yang, Hefei (CN); Zinian Chen, Hefei (CN); Wei Li, Hefei (CN); Dengfeng Cheng, Hefei (CN); Yongkang Huang, Hefei (CN); Jingjing Dong, Hefei (CN); Wenhui Tong, Hefei (CN); Cuicui Wang, Hefei (CN)

(73) Assignees: ANHUI ELECTRIC POWER RESEARCH INSTITUTE, Hefei, Anhui (CN); SUZHOU HD ELECTRIC CO., LTD., Suzhou, Jiangsu (CN); STATE GRID CORPORATION OF CHINA (SGCC), Beijing (CN)

( * ) Notice: Subject to any disclaimer, the term of this patent is extended or adjusted under 35 U.S.C. 154(b) by 340 days.

(21) Appl. No.: 13/810,318

(22) PCT Filed: Sep. 22, 2011

(86) PCT No.: PCT/CN2011/080008
§ 371 (c)(1),
(2), (4) Date: Jan. 15, 2013

(87) PCT Pub. No.: WO2012/151836
PCT Pub. Date: Nov. 15, 2012

(65) Prior Publication Data
US 2014/0072950 A1  Mar. 13, 2014

(30) Foreign Application Priority Data
May 10, 2011  (CN) .......................... 2011 1 0118892

(51) Int. Cl.
*G06G 7/54* (2006.01)
*G09B 23/18* (2006.01)
(Continued)

(52) U.S. Cl.
CPC ............. *G09B 23/181* (2013.01); *G09B 23/18* (2013.01); *G01R 27/16* (2013.01); *G01R 31/08* (2013.01)

(58) Field of Classification Search
CPC ..... G09B 23/181; G09B 9/00; G09B 23/183
USPC ......................................................... 703/18
See application file for complete search history.

(56) References Cited

U.S. PATENT DOCUMENTS

2004/0073387 A1   4/2004 Larsson et al.

FOREIGN PATENT DOCUMENTS

| CN | 2722259 Y | 8/2005 |
|---|---|---|
| CN | 101789602 A | 7/2010 |

(Continued)

OTHER PUBLICATIONS

J.A. Peças Lopes, C.L. Moreira, F.O. Resende Control strategies for microgrids black start and islanded operation Int J Distr Energy Resour, 2 (3) (2006), pp. 211-231.*

(Continued)

*Primary Examiner* — Kamini S Shah
*Assistant Examiner* — Scott S Cook
(74) *Attorney, Agent, or Firm* — Harness, Dickey & Pierce, P.L.C.

(57) ABSTRACT

A power frequency parameter simulation system for a power transmission line and a control method thereof, the system includes a simulation main circuit (1), an interference power supply (2) and a procedure controller (3). In the system, a power frequency parameter of a 10 to 100 kilometers of 500 kV power transmission line is simulated in a lumped parameter manner; and the control method includes the following steps of: a step to detect the automatically zeroing during starting up, a step to control the reduction of the length of a simulation line and a step to control a simulation interference voltage. A long-distance power transmission line is realized to be moved into a room and be tested by means of the power frequency parameter test system, so the various inconveniences of on-site measurement are avoided.

7 Claims, 2 Drawing Sheets

(51) Int. Cl.
*G01R 27/16* (2006.01)
*G01R 31/08* (2006.01)

(56) References Cited

FOREIGN PATENT DOCUMENTS

| CN | 201639294 U | 11/2010 |
|---|---|---|
| CN | 101938125 A | 1/2011 |
| CN | 102184656 A | 9/2011 |
| EP | 1976089 A2 | 10/2008 |

OTHER PUBLICATIONS

BlackStart_Archived_2-10-2011.pdf, Black Start defined, Archived Feb. 10, 2011 https://en.wikipedia.org/w/index.php?title=Black_start&oldid=413200729.*

Transformer.pdf, "One Transformer . . . Many Voltages", Superior Electric, Aug. 17, 2009.*

Fitzpatrick, R., Resistors in Series and in Parallel, Jul. 14, 2007 downloaded from http://farside.ph.utexas.edu/teaching/302l/lectures/node58.html.*

Bakshi, U.A., Electrical Machines, First Edition 2009 Technical Publications Pune ISBN 9788184316964.*

Martin, L.S., Modeling for Computer Simulation as a Tool for the Teaching of Transient Power Systems, Powering 2009, Lisbon, Portugal, Mar. 18-20, 2009 IEEE pp. 629-634.*

Mohammed, O.A., A Laboratory Based Microgrid and Distributed Generation Infrastructure for Studying Connectivity Issues to Operational Power Systems, 2010 IEEE.*

Leger, A.S., Transmission Line Modeling for the Purpose of Analog Power Flow Computation of Large Scale Power Systems, 2005.*

Lidula (Microgrids research: A review of experimental microgrids and test systems, Renewable and Sustainable Energy Reviews, vol. 15, Issue 1, Available online Oct. 1, 2010).*

Mehr, V.S.P., AC 2011-1718: Implementation of Laboratory-Based Smart Power System, 2011.*

Zhang, H., Hardware Development of a Laboratory-Scale Microgrid Phase 2: Operation and Control of a Two-Inverter Microgrid, Mar. 2004 NREL/SR-560-35059.*

Leyua, P., Interfacing switches and relays to the real world in real time, www.ednmag.com Jun. 3 7, 2001 EDN.*

International Search Report (in Chinese with English translation) and Written Opinion (in Chinese) for PCT/CN2011/080008, mailed Mar. 1, 2012; ISA/CN.

* cited by examiner

POWER FREQUENCY PARAMETER SIMULATION SYSTEM FOR A POWER TRANSMISSION LINE AND CONTROL METHOD THEREOF

CROSS-REFERENCE TO RELATED APPLICATIONS

This application is a 371 National Stage Application of International Application No. PCT/CN2011/080008, filed on Sep. 22, 2011, which claims the priority of Chinese Patent Application No. 201110118892.1, entitled "SIMULATION SYSTEM OF POWER FREQUENCY PARAMETER OF TRANSMISSION LINE AND CONTROL METHOD THEREOF", filed with the Chinese Patent Office on May 10, 2011, which applications are hereby incorporated by reference in their entirety.

FIELD OF THE INVENTION

The present invention relates to the field of test of the power transmission and transformation, and in particular to a simulation system of a power frequency parameter of a transmission line and a control method thereof, the system and the control method are to simulate a frequency parameter of an actual line and implement a analysis and test of the actual line in a laboratory.

BACKGROUND OF THE INVENTION

For a parameter test of a transmission line, it generally needs to cut off the power of the line to test the parameter on the spot, which is not convenient for training testing personnel by using various instruments, easily induces safety accidents, and cannot detect anti-interference capability of a test instrument in advance, so as to obtain an inaccurate test result of the test instrument with the poor anti-interference capability.

SUMMARY OF THE INVENTION

An object of the present invention is to provide a technical solution of a simulation system of a power frequency parameter of a transmission line and a control method thereof. In this solution, frequency distribution parameters, such as the resistance of the wire, the inductor, the capacitor (ground capacitor and phase-to-phase capacitor), and an interference voltage of a transmission line power with a length of 10-100 km and a voltage of 500 kV are simulated in a manner of lumped parameter, which is used to test and train the power frequency parameter of the line and adapted to a line parameter tester produced by most existing manufacturers in our country.

In order to achieve the above object, the technical solution of the present invention is implemented as follow.

A simulation system of a power frequency parameter of a transmission line includes a simulated main line, an interference power and a program controller; the simulated main line includes an electric voltage regulator with three respectively independent phases, and three single phase transformers, where the inputs of the three single phase transformers are correspondingly connected to the outputs of the electric voltage regulator with three independent phases respectively; the interference power comprises a three-phase electric voltage regulator and a three-phase transformer, where the three-phase voltages outputted by the three-phase transformer are different from each other, the outputs of the three-phase electric voltage regulator are connected to the inputs of the three-phase transformer; voltage and current signal sensors are provided at the outputs of the three single phase transformers, voltage signal sensors are provided at the three-phase outputs of the three-phase transformer respectively, reset signal sensors are provided at the electric voltage regulator with three independent phases and the three-phase electric voltage regulator respectively, all signal sensors are connected to the signal collection end of the program controller, a control output of the program controller is connected to control inputs of the electric voltage regulator with three independent phases and the three-phase electric voltage regulator; the three phase outputs of the three single phase transformers of the simulated main line are connected to π-type impedance circuits respectively, a front branch and a rear branch of the π-type impedance circuit are a phase-to-phase capacitor and a ground capacitor respectively, and a resistance and an inductor are provided in series between the front branch and the rear branch, the phase-to-phase capacitor is adapted to perform a phase-to-phase connection of capacitors through a phase-to-phase switch, the ground capacitor is adapted to connect the capacitor to the ground through a grounding switch, a short circuit switch is connected in parallel with the resistance and the inductor connected in series, a connection terminal between the front branch and the outputs of the three single phase transformers is a output front end of the three single phase transformers, and the rear branch is a output tail end; the output tail end is provided with a three-phase short circuit switch, a grounding loop resistance and a decoupling inductor are provided between a short circuit point of the three-phase short circuit switch and the ground, the grounding loop resistance is connected with the decoupling inductor in series, one end of the grounding loop resistance is connected to the ground, a resistance short circuit switch is connected in parallel with the grounding loop resistance, a decoupling inductor short circuit switch is connected in parallel with the decoupling inductor; three-phase voltages outputted from the three-phase transformer of the interference power are connected to the output front end corresponding to the three phase outputs of the three single phase transformers of the simulated main line through a switch and a coupling capacitor.

There are multiple π-type impedance circuits connected in series. In addition, there are multiple grounding loop resistances connected in series, and each of the grounding loop resistances is connected in parallel with a resistance short circuit switch. There are multiple decoupling inductors which are connected in series, and each of the multiple decoupling inductors is connected in parallel with a decoupling inductor short circuit switch.

The capacitance of the coupling capacitor ranges from 22 to 100 millimicrofarad.

The simulated main line is 500 kV simulated transmission line, and the voltage of the electric voltage regulator with three independent phases ranges from 0 to 500V. The voltage of the interference power ranges from 0 to 500V, three-phase voltages outputted by the three-phase transformer of the interference power are divided by a switch into three groups of outputs which are connected to the output front end corresponding to three phase outputs of three single phase transformers through three groups of coupling capacitors, where the capacitance of the three groups of coupling capacitors are 22 millimicrofarad, 44 millimicrofarad and 100 millimicrofarad respectively.

The multiple π-type impedance circuits are π-type impedance circuits of 10 kilometers, 20 kilometers, 30 kilometers and 40 kilometers respectively, the multiple grounding loop resistances are grounding loop resistances of 10 kilometers, 20 kilometers, 30 kilometers and 40 kilometers respectively, and the multiple decoupling inductors are decoupling inductors of 10 kilometers, 20 kilometers, 30 kilometers and 40 kilometers respectively.

A voltage adjustment motor of the electric voltage regulator is separated from the simulated main line and the interference power to be powered.

A control method of a simulation system of a power frequency parameter of a transmission line, comprises the simulation system of the power frequency parameter of the transmission line described above, where the π-type impedance circuits are π-type impedance circuits of 10 kilometers, 20 kilometers, 30 kilometers and 40 kilometers respectively, the grounding loop resistances are grounding loop resistances of 10 kilometers, 20 kilometers, 30 kilometers and 40 kilometers respectively, the decoupling inductors are decoupling inductors of 10 kilometers, 20 kilometers, 30 kilometers and 40 kilometers respectively, simulated line voltages of 10 kilometers, 20 kilometers, 30 kilometers and 40 kilometers are set to corresponding to the above parameters; the control method comprises the following steps: a step for detecting and automatically returning to zero when starting up, a step for controlling to shorten the simulated line length, and a step for controlling to simulate an interference voltage;

the step for detecting and automatically returning to zero when starting up including: starting up and detecting a zero state of each voltage regulators, and automatically returning the voltage regulator which is not in the zero state to zero;

the step for controlling to shorten the simulated line length including: when a line length parameter is shortened, firstly decreasing the voltage to a voltage corresponding to the simulated line length, and then changing the parameter to a parameter corresponding to the line length;

the step for controlling to simulate the interference voltage including: when an interference voltage needs to be applied on the simulated line, firstly turning on the power of the interference power, switching the simulated line length to the maximum length of the line, increasing or decreasing the output of the interference voltage to a required interference voltage, applying the interference voltage to a phase line of the simulated line.

The embodiment of the present invention has the following advantages. The power of the line does not need to be cut off when the parameter of the transmission line is tested on the spot traditionally, an intelligent control to the simulated transmission line can be implemented by collecting and analyzing signals using a program controller; various line parameter tests and examinations are simply implemented in a laboratory, and the anti-interference capability of the test instrument can be tested.

DETAILED DESCRIPTION OF THE INVENTION

In order to make the above objects, features and advantages of the present invention more apparent, specific embodiments of the present invention will be described in detail below with reference to the drawings.

Embodiment 1

Figure 1:
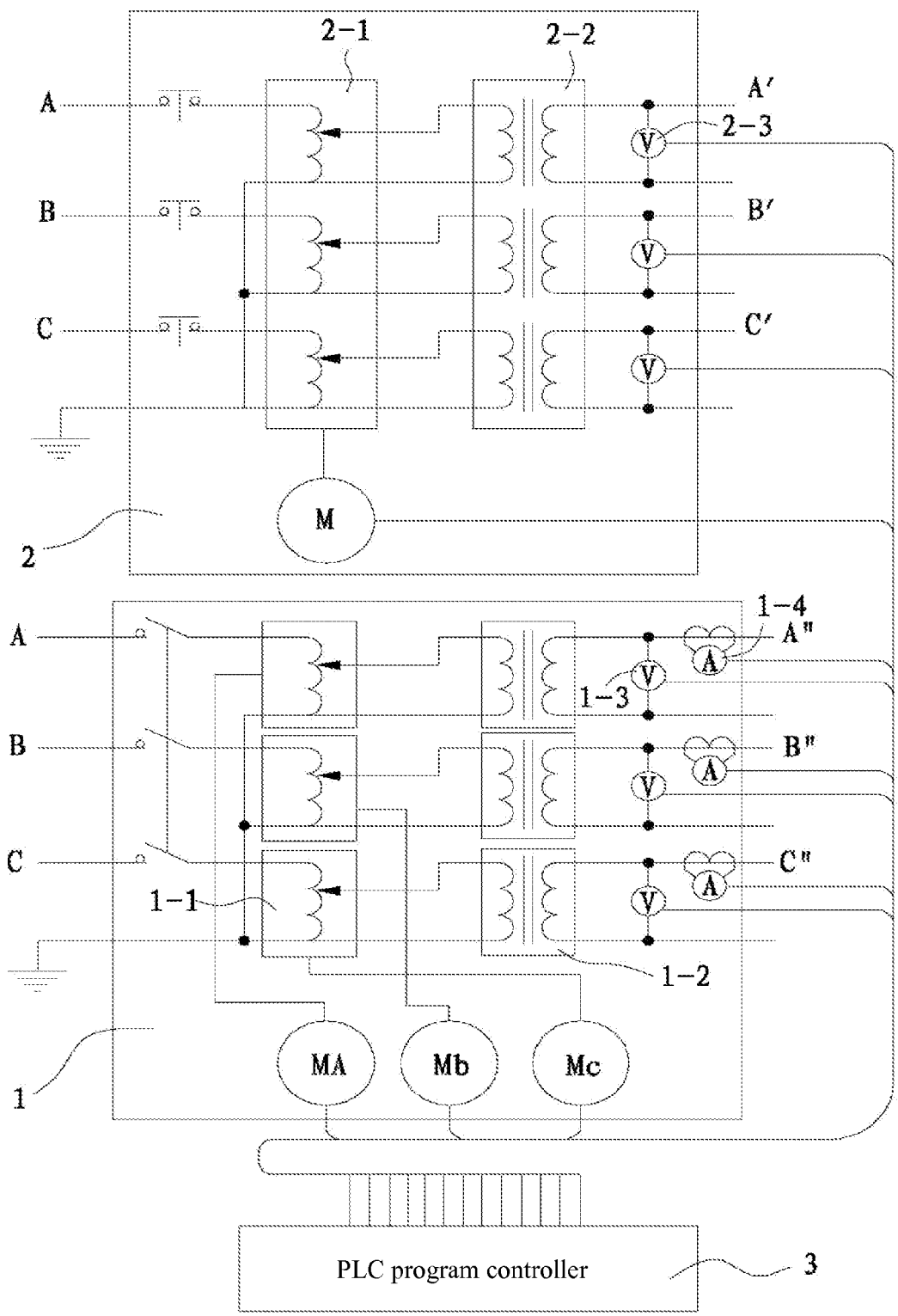
FIG. 1 is a schematic diagram of a power circuit of a control system according to the present invention.
Figure 2:
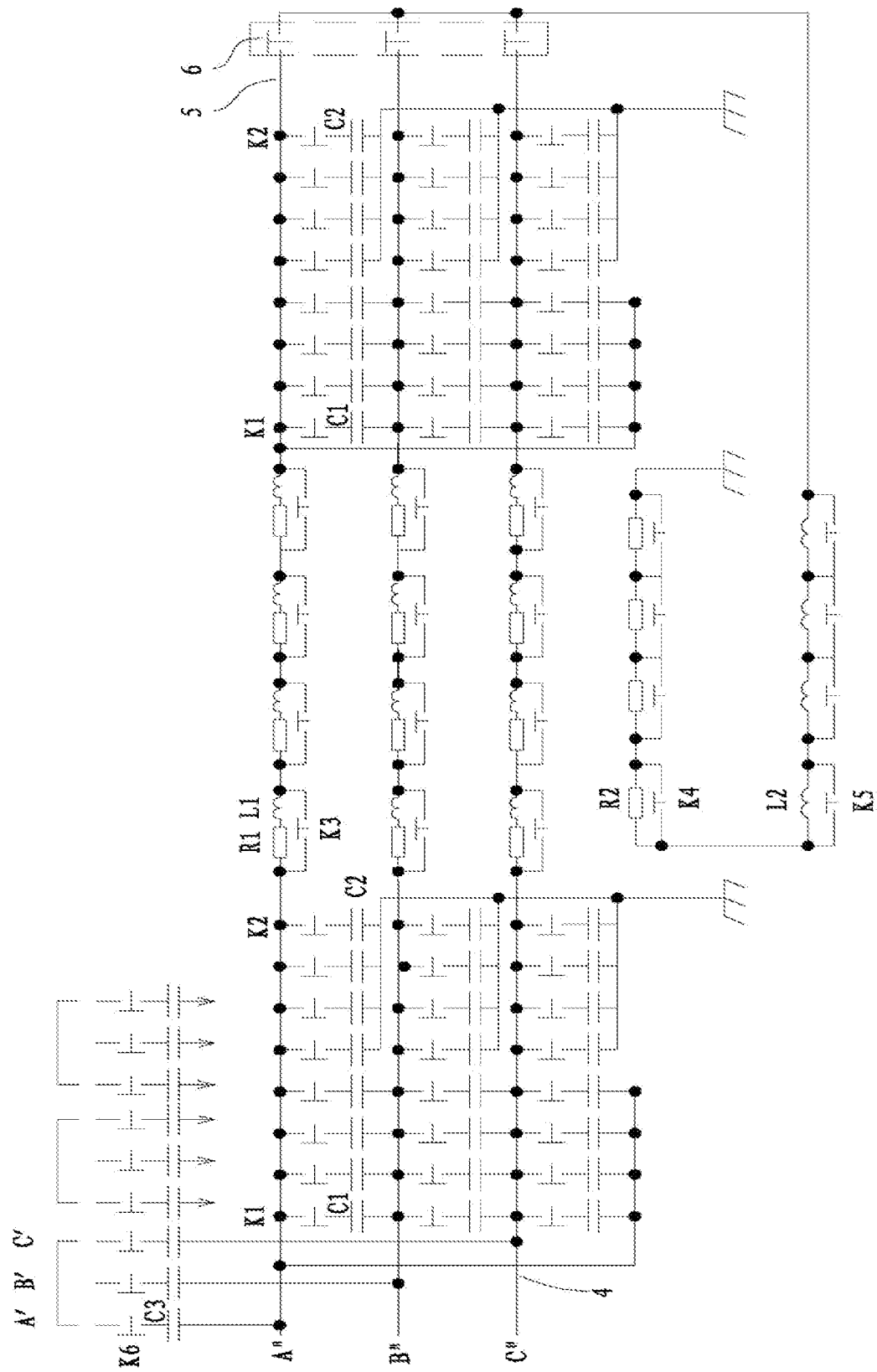
FIG. 2 is a schematic diagram of a four-way parameter access circuit of a control system according to the present invention.

An embodiment of a simulation system of a power frequency parameter of a transmission line is provided with reference to FIGS. 1 and 2. The system includes a simulated main line 1, an interference power 2 and a program controller 3. The simulated main line includes an electric voltage regulator 1-1 with three independent phases; and three single phase transformers 1-2, where the inputs of the three single phase transformers are correspondingly connected to the outputs of the electric voltage regulator with three independent phases respectively. The interference power includes a three-phase electric voltage regulator 2-1 and a three-phase transformer 2-2, where the three-phase voltages outputted by the three-phase transformer are different from each other, and the outputs of the three-phase electric voltage regulator are connected to the inputs of the three-phase transformer. Voltage sensors 1-3 and current signal sensors 1-4 are provided at each of the outputs of the three single phase transformers, voltage signal sensors 2-3 are provided at each of three-phase outputs of the three-phase transformer, and the electric voltage regulator with three independent phases and the three-phase electric voltage regulator are provided with reset signal sensors respectively. All signal sensors are connected to a signal collection end of a program controller respectively, and a control output of the program controller is connected to the control inputs of the electric voltage regulator with three independent phases and the three-phase electric voltage regulator to control the drive motors M, MA, MB and MC. The three phase outputs of the three single phase transformers of the simulated main line are connected to a π-type impedance circuit, front branch and rear branch of the π-type impedance circuit are phase-to-phase capacitors C1 and ground capacitors C2 respectively, and resistances R1 and inductors L1 are provided between the front branch and the rear branch in series. The phase-to-phase capacitors implement phase-to-phase connection of capacitors through phase-to-phase switches K1, the ground capacitors connect the capacitors to the ground through grounding switches K2, and short circuit switches K3 are connected in parallel with the resistances and the inductors connected in series. A connection terminal between the front branch and the outputs of the three single phase transformers is called an output front end 4 of three single phase transformers, and the rear branch is called output tail end 5. The output tail end is provided with a three-phase short circuit switch 6, and a grounding loop resistance R2 and a decoupling inductor L2 are provided between a short circuit point of the three-phase short circuit switch and the ground. The grounding loop resistance is connected with the decoupling inductor in series, one end of the grounding loop resistance is connected to the ground, a resistance short circuit switch K4 is connected in parallel with the grounding loop resistance, and a decoupling inductor short circuit switch K5 is connected in parallel with the decoupling inductor. Three-phase voltages outputted by the three-phase transformer of the interference power are connected to the output front end corresponding to the three phase outputs of the three single phase transformers of the simulated main line through switches K6 and coupling capacitors C3.

Particularly, the capacitor, resistance and inductor of the π-type impedance circuit are calculated from an equivalent circuit of the simulated line length. In order to simulate impedances of lines with different lengths, there are multiple π-type impedance circuits, multiple π-type impedance circuits are connected in series (a phase-to-phase capacitor and a ground capacitor of each of multiple π-type impedance circuits are connected in parallel; and a resistance and a inductor of each of multiple π-type impedance circuits which are provided between the phase-to-phase capacitor and the ground capacitor are connected in series). There are multiple grounding loop resistances which are connected in series, and each of the grounding loop resistances is connected in parallel with a resistance short circuit switch. There are multiple decoupling inductors which are connected in series, and each of the decoupling inductors is connected in parallel with a decoupling inductor short circuit switch.

In order to restrain the generation of the large current when an interference voltage is used, the capacitance of the coupling capacitor is selected between 22 millimicrofarad (nF) to 100 millimicrofarad (nF).

Particularly, in the case of the measurement of the positive sequence impedance and zero sequence impedance of the line, the end grounds, the resistance is ignored, each phase of the three-phase line has self inductance, and there is mutual inductance between phases. Since the π-type impedance circuit uses a lumped parameter instead of a distributed parameter, there is no mutual inductance between phases when using the lumped inductor, so that the lumped inductor is hard to be implemented in the circuit. Thus, in order to make the inductor of the simulated line similar as the actual inductor and make the parameter of the simulated line more accurate, the decoupling inductor is added at the tail end of the simulated line according to circuit principles, self inductance of each phases is changed after the decoupling inductor is added, such that the measured result is closer to the parameter of the actual circuit, these parameters can be obtained by practice measurement and calculation.

The simulated main line of the present embodiment is a transmission line of 500 kV, the simulated voltage of the electric voltage regulator with three independent phases thereof is adjusted within a range from 0 to 500V. Further, the interference power is adjusted from 0 to 500V. As shown in FIG. 2, the three-phase voltage outputted by the three-phase transformer of the interference power is divided into three groups of outputs by a switch, the three groups of outputs are connected to the output front end corresponding to the outputs of the three single phase transformers through three groups of coupling capacitors. The capacitances of the three groups of coupling capacitors are 22 millimicrofarad, 44 millimicrofarad and 100 millimicrofarad respectively.

The multiple π-type impedance circuits shown in FIG. 2 are the π-type impedance circuits of 10 kilometers, 20 kilometers, 30 kilometers and 40 kilometers respectively. The resistances of the multiple grounding loops are the resistances of the grounding loop of 10 kilometers, 20 kilometers, 30 kilometers and 40 kilometers respectively. The multiple decoupling inductors are the decoupling inductors of 10 kilometers, 20 kilometers, 30 kilometers and 40 kilometers respectively. Values of the above parameters may be calculated by an equivalent circuit. The capacitances of the four phase-to-phase capacitors C1 are 0.01, 0.02, 0.03, 0.04 microfarad respectively; the capacitances of the four ground capacitors C2 are 0.015, 0.03, 0.045, 0.06 microfarad respectively; the resistances of the four resistors R1 are 0.15, 0.3, 0.45, 0.6 ohm respectively; the inductances of the four inductors L1 are 8.9, 17.8, 26.7, 35.6 millihenry respectively; and the resistances of the four grounding loop resistors R2 are 0.5, 1.0, 1.5, 2.0 ohm respectively.

In order to enable the voltage regulator to return to zero when the simulated main line and the interference power is powered off, the voltage adjustment motor of the electric voltage regulator is separated from the simulated main line and the interference power to be powered.

Embodiment 2

A control method of a simulation system of a power frequency parameter of a transmission line includes the simulation system of the power frequency parameter of the transmission line described in embodiment 1 above. The π-type impedance circuits are the π-type impedance circuits of 10 kilometers, 20 kilometers, 30 kilometers and 40 kilometers respectively. The grounding loop resistances are the grounding loop resistances of 10 kilometers, 20 kilometers, 30 kilometers and 40 kilometers respectively. The decoupling inductors are the decoupling inductors of 10 kilometers, 20 kilometers, 30 kilometers and 40 kilometers respectively. The simulated line voltages of 10 kilometers, 20 kilometers, 30 kilometers and 40 kilometers are set corresponding to the above parameters. The control method of the simulation system of the power frequency parameter of the transmission line includes the following steps: a step for detecting and automatically returning to zero when starting up, a step for controlling to shorten the simulated line length, and a step for controlling to simulate an interference voltage;

the step for detecting and automatically returning to zero when starting up including: detecting the zero state of each voltage regulators when starting up, and automatically returning the voltage regulators which are not in the zero state to zero;

the step for controlling to shorten the simulated line length including: when a line length parameter is shortened, firstly decreasing the voltage to a voltage corresponding to the simulated line length, and then changing the parameter to a parameter corresponding to the line length;

the step for controlling to simulate the interference voltage including: when an interference voltage needs to be applied to the simulated line, firstly turning on the power of the "interference power", switching the simulated line length to any line length, increasing or decreasing the output of the interference voltage to a required interference voltage, and applying the interference voltage to the phase line of the simulated line.

Corresponding relationships of the parameter and the voltage value of the simulated line lengths are 10 kilometers: 30V, 20 kilometers:60V, 30 kilometers:90V, 40 kilometers: 120V, 50 kilometers: 150V, 60 kilometers: 180V, 70 kilometers:210V, 80 kilometers:240V, 90 kilometers:270V, 100 kilometers:300V.

According to the above embodiment 1 and embodiment 2, the distribution parameter of the transmission line of 500 kV is simulated in a manner of the lumped parameter, the line of 100 kilometers may be divided into 10 equal portions by four groups of parameter combinations, the line is applied a simulation power which is superposed with an interference power, the induced voltage of the line and the interference power will affect the measurement of the power frequency parameter tester when testing the power frequency parameter of the simulated line. Therefore, the capability of the power frequency parameter tester against the interference power and the influence of the interference power on the accuracy of the test result may be detected by this system.

In theory, the transmission line is a symmetrical passive two-port network, and may be represented by a symmetrical equivalent circuit. Generally, there are two kinds of the equivalent circuit of the transmission line, i.e., π-type and T-type circuits. In engineering, there is a requirement of ensuring the necessary accuracy and simplifying the calculation as possible. When the approximate parameter is used, it is more precise to substitute a π-type circuit for the line, the length of which is no long than 300 km; and longer line can be simulated by several π-type circuits connected in series.

Therefore, according to the present invention, the π-type circuit of the lumped parameter of the transmission line is replaced by the distribution parameter features thereof, and the total length of the line is 100 kilometers. The front and rear branches of the π-type circuit are the phase-to-phase capacitor and the ground capacitor, the resistor and inductor are provided between the front and rear branches of the π-type circuit. The lines with various lengths (there are ten different lengths of 10 kilometers, 20 kilometers, . . . , 100 kilometers) are represented by adjusting the values of the resistors, the inductors and the capacitors. When a parameter switching circuit is adjusted, the phase-to-phase capacitor, the ground capacitor, the resistor and the inductor may be simultaneously switched to parameters of the same line length. In order to ensure the accuracy of the π-type circuit, a grounding loop impendence of a corresponding length is provided when the zero sequence impedance is tested. An inductor $L_2$ is added at the tail end when the impendence is tested. This inductor needs to be added at the tail end when a lumped parameter is formed after a three-phase line decoupling, which can be obtained by the calculation. 10 equivalent portions of 100 kilometers line length can be switched in a binary combination mode, a 1, 2, 3, 4 combination mode, or a manually stepped combination mode, i.e., the combination mode which can be determined by internal software intelligently when the line length needs to shortened.

During the test of the power frequency parameters of the line, a high voltage may be induced from an operating line or device nearby, which will affect the safety of the testing personnel and the accuracy of the tested data. The induced voltage mainly includes a capacitive coupling inducted voltage and electromagnetic coupling inducted voltage. The value of the interference voltage ranges from hundreds of Volts to about a dozen of kilovolts according to the coupling compactness and the voltage level of the interference line. In the system according to the invention, a simulated capacitive coupling inducted voltage is applied by superposing the interference power on the tested power and simulating the affection on the tested loop.

The interference voltage is applied on the tested loop by a voltage regulator via isolation transformers and capacitors according to the capacitor coupling principle. In the present embodiment, there are three interference sources, any one of which can be added. Since the values of the coupling capacitors and the coupling energies are different, voltages coupled to the line and the interference effects are different. The interference voltages of each phases in each interference sources are different, which are adjusted synchronously by the voltage regulator in front of the capacitor, so as to ensure that the voltages of the three phases coupled to the line are different, and thus achieving the simulated interference effect on the tested loop. The interference voltage can be added when various parameters of the line of any lengths are tested. During an examination, due to the use of the capacitive coupling mode, the interference can be added to the loop power and the interference power without phase synchronization. In the case of the selection of the coupling capacitor, the value of the current flowing through the capacitor needs to be restricted, which is no greater than 150 mA. Therefore, the capacitance of the capacitor should be small enough, which should be smaller than 150 nF; and the capacitive reactance of the capacitor should be larger enough to restrict current flowing through the capacitor. According to the calculation, the capacitors of 22 nF, 44 nF, 100 nF are selected. The three-phase synchronization adjustable interference power outputs discontinuously: A-phase 0-200V; B-phase 0-300V; C-phase 0-500V.

When "the interference power" is turned on, the system is automatically switched to a position of the longest line length. One of the interference one, two and three is cliched. When the interference light is turned on to flash, a button for increasing or decreasing the interference voltage is pressed for a long time to adjust the value of the voltage to be interfered with the simulated line, and then a flashing button light is clicked again, the corresponding interference voltage is added when the light is always being on.

After "the voltage adjustment power" is turned on, in the case of "synchronized voltage adjustment", the button for increasing or decreasing the voltage of any phase is pressed for a long time, and the voltage of each phases of the simulated line are adjusted simultaneously. In the case of "independent voltage adjustment", the button for increasing or decreasing the voltage of any phase is pressed for a long time, and the voltage of the simulated line of a corresponding phase is adjusted independently. These two modes may be switched to each other to perform the control.

In the embodiment, the default set when starting up is at the position of the longest line length, such as 100 kilometers, i.e., 10+20+30+40=100 kilometers. When the user wants to shorten the line length, the system will automatically decrease the voltage, and then switching to a position of the current line length, so as to avoid a too large current when switching to a position of a shorter length. In the case of the independent voltage adjustment, the system decreases voltages of each phases to a same automatically decreased voltage value, and then the user performs a corresponding test of the independency voltage adjustment. When the length of the simulated line is lengthened by the voltage adjustment power, the system will not automatically adjust the voltage.

When an interference voltage needs to be applied to the simulated line, "interference power" is clicked to turn on the power, and at this time, the system automatically switches the length of the simulated line to the position of the longest line length, such as 100 kilometers. The interference type one, two or three is clicked, and at this time, a corresponding interference light flashes, the interference voltage output need to be adjusted increasedly or decreasedly until the voltage is adjusted to an appropriate interference voltage, and then the interference voltage is superposed to a phase line of the simulated line.

The voltage adjustment mode of the present system includes: the synchronized voltage adjustment and the independent voltage adjustment, which can be switched each other during the voltage adjustment and are variable only if "the voltage adjustment power" is used. In a default state, in the case of the synchronized voltage adjustment, when any of the voltage increasing buttons A, B, C is pressed, the three-phase voltages are increased synchronically; when any of the voltage decreasing buttons A, B, C is pressed, the three-phase voltages are decreased synchronically; and the voltage increase and decrease is stopped when the voltage increasing or decreasing button is released. When switching to the independent voltage adjustment, the A-phase voltage increasing or decreasing button is pressed, and then the A-phase regulator outputs the increased or decreased voltage, and other regulators is not performed. There are similar operations when the B-phase or C-phase voltage increasing or decreasing button is pressed. The three phases will not interfere with each other. However, if the increase of the voltage is too large, the system is likely to perform overcurrent protection. If the voltage is firstly adjusted independently and then adjusted synchronously, during the synchronized voltage adjustment for voltage increase, the system firstly increases voltages to the highest phase voltage among the three phases, and then three voltage regulators increase the voltages together; and during the synchronized voltage adjustment for voltage decrease, the system firstly decreases voltages to the lowest phase voltage among the three phases, and then decreases the voltages together.

The above is merely preferred embodiments of the present invention, and not intends to make any formally restriction to the present invention. Although the present invention is disclosed above as preferred embodiments, the embodiments are not used to limit the present invention. Skilled in the art may use the above disclosed method and technical contents to make possible amendments and modifications to the technical solution of the present invention, or amend the technical solution of the present invention to an equivalent embodiment, without departing from the scope of the technical solution of the present invention. Therefore, any contents which do not depart from contents of the technical solution of the present invention, and any simple amendments, equivalent changes and retouches to the above embodiments according to the technical substance of the present invention belong to the scope of the technical solution of the present invention.

What is claimed is:

1. A simulation system of a power frequency parameter of a transmission line, comprising a simulated main line, an interference power and a program controller, wherein the simulated main line comprises an electric voltage regulator with three independent phases, and three single phase transformers, the inputs of the three single phase transformers are correspondingly connected to the outputs of the electric voltage regulator with three independent phases respectively; the interference power comprises a three-phase electric voltage regulator and a three-phase transformer, three-phase voltages outputted by the three-phase transformer are different from each other, the outputs of the three-phase electric voltage regulator are connected to the inputs of the three-phase transformer; voltage signal sensors and current signal sensors are provided at the outputs of the three single phase transformers, voltage signal sensors are provided at the three-phase outputs of the three-phase transformer respectively, reset signal sensors are provided at the electric voltage regulator with three independent phases and the three-phase electric voltage regulator respectively, all signal sensors are connected to the signal collection end of the program controller, a control output of the program controller is connected to the control input of the electric voltage regulator with three independent phases and the control input of the three-phase electric voltage regulator; three phase outputs of the three single phase transformers of the simulated main line are connected to a π-type impedance circuit respectively, a front branch and a rear branch of the π-type impedance circuit are a phase-to-phase capacitor and a ground capacitor respectively, and a resistance and a inductor are provided in series between the front branch and the rear branch, the phase-to-phase capacitor is adapted to perform a phase-to-phase connection of capacitors through a phase-to-phase switch, the ground capacitor is adapted to connect the capacitor to the ground through a grounding switch, a short circuit switch is connected in parallel with the resistance and the inductor connected in series, a connection terminal between the front branch and the outputs of the three single phase transformers is an output front end of the three single phase transformers, and the rear branch is an output tail end; the output tail end is provided with a three-phase short circuit switch, a grounding loop resistance and a decoupling inductor are provided between a short circuit point of the three-phase short circuit switch and the ground, the grounding loop resistance is connected with the decoupling inductor in series, one end of the grounding loop resistance is connected to the ground, a resistance short circuit switch is connected in parallel with the grounding loop resistance, a decoupling inductor short circuit switch is connected in parallel with the decoupling inductor; the three-phase voltages outputted from the three-phase transformer of the interference power are connected to the output front end corresponding to the three phase outputs of the three single phase transformers of the simulated main line through a switch and a coupling capacitor.

2. The simulation system of the power frequency parameter of the transmission line according to claim 1, wherein there are multiple π-type impedance circuits connected in series; there are multiple grounding loop resistances connected in series, each of the grounding loop resistances is connected in parallel with a resistance short circuit switch; there are multiple decoupling inductors connected in series, each of the multiple decoupling inductors is connected in parallel with a decoupling inductor short circuit switch.

3. The simulation system of the power frequency parameter of the transmission line according to claim 1, wherein the capacitance of the coupling capacitor ranges from 22 millimicrofarad to 100 millimicrofarad.

4. The simulation system of the power frequency parameter of the transmission line according to claim 1, wherein the simulated main line is 500 kV simulated transmission line, the voltage of the electric voltage regulator with three independent phases ranges from 0 to 500V; the voltage of the interference power ranges from 0 to 500V, the three-phase voltages outputted by the three-phase transformer of the interference power are divided by a switch into three groups of outputs which are connected to the output front end corresponding to three phase outputs of three single phase transformers through three groups of coupling capacitors, the capacitances of the three groups of coupling capacitors are 22 millimicrofarad, 44 millimicrofarad and 100 millimicrofarad respectively.

5. The simulation system of the power frequency parameter of the transmission line according to claim 2, wherein the multiple π-type impedance circuits are π-type impedance circuits of 10 kilometers, 20 kilometers, 30 kilometers and 40 kilometers respectively, the multiple grounding loop resistances are grounding loop resistances of 10 kilometers, 20 kilometers, 30 kilometers and 40 kilometers respectively, the multiple decoupling inductors are decoupling inductors of 10 kilometers, 20 kilometers, 30 kilometers and 40 kilometers respectively.

6. The simulation system of the power frequency parameter of the transmission line according to claim 1, wherein a voltage adjustment motor of the electric voltage regulator is separated from the simulated main line and the interference power to be powered.

7. A control method of a simulation system of a power frequency parameter of a transmission line, wherein the simulation system of the power frequency parameter of the transmission line comprises a simulated main line, an interference power and a program controller, wherein the simulated main line comprises an electric voltage regulator with three independent phases, and three single phase transformers, the inputs of the three single phase transformers are correspondingly connected to the outputs of the electric voltage regulator with three independent phases respectively; the interference power comprises a three-phase electric voltage regulator and a three-phase transformer, three-phase voltages outputted by the three-phase transformer are different from each other, the outputs of the three-phase electric voltage regulator are connected to the inputs of the three-phase transformer; voltage signal sensors and current signal sensors are provided at the outputs of the three single phase transformers, voltage signal sensors are provided at the three-phase outputs of the three-phase transformer respectively, reset signal sensors are provided at the electric voltage regulator with three independent phases and the three-phase electric voltage regulator respectively, all signal sensors are connected to the signal collection end of the program controller, a control output of the program controller is connected to the control input of the electric voltage regulator with three independent phases and the control input of the three-phase electric voltage regulator; three phase outputs of the three single phase transformers of the simulated main line are connected to a π-type impedance circuit respectively, a front branch and a rear branch of the π-type impedance circuit are a phase-to-phase capacitor and a ground capacitor respectively, and a resistance and a inductor are provided in series between the front branch and the rear branch, the phase-to-phase capacitor is adapted to perform a phase-to-phase connection of capacitors through a phase-to-phase switch, the ground capacitor is adapted to connect the capacitor to the ground through a grounding switch, a short circuit switch is connected in parallel with the resistance and the inductor connected in series, a connection terminal between the front branch and the outputs of the three single phase transformers is an output front end of the three single phase transformers, and the rear branch is an output tail end; the output tail end is provided with a three-phase short circuit switch, a grounding loop resistance and a decoupling inductor are provided between a short circuit point of the three-phase short circuit switch and the ground, the grounding loop resistance is connected with the decoupling inductor in series, one end of the grounding loop resistance is connected to the ground, a resistance short circuit switch is connected in parallel with the grounding loop resistance, a decoupling inductor short circuit switch is connected in parallel with the decoupling inductor; the three-phase voltages outputted from the three-phase transformer of the interference power are connected to the output front end corresponding to the three phase outputs of the three single phase transformers of the simulated main line through a switch and a coupling capacitor, wherein the π-type impedance circuits are π-type impedance circuits of 10 kilometers, 20 kilometers, 30 kilometers and 40 kilometers respectively; the grounding loop resistances are grounding loop resistances of 10 kilometers, 20 kilometers, 30 kilometers and 40 kilometers respectively; the decoupling inductors are decoupling inductors of 10 kilometers, 20 kilometers, 30 kilometers and 40 kilometers respectively; simulated line voltages of 10 kilometers, 20 kilometers, 30 kilometers and 40 kilometers are set correspondingly; the control method comprises: a step for detecting and automatically returning to zero when starting up, a step for controlling to shorten the simulated line length, and a step for controlling to simulate an interference voltage; and wherein the step for detecting and automatically returning to zero when starting up comprises: starting up and detecting a zero state of each voltage regulators, and automatically returning the voltage regulator which is not in the zero state to zero;

the step for controlling to shorten the simulated line length comprises: when the line length parameter is shortened, firstly decreasing the voltage to a voltage corresponding to the simulated line length, and then changing the parameter to a parameter corresponding to the line length;

the step for controlling to simulate the interference voltage comprises: when an interference voltage needs to be applied on the simulated line, firstly turning on the power of the interference power, switching the simulated line length to a position of any line length, increasing or decreasing the output of the interference voltage output to a required interference voltage, applying the interference voltage to a phase line of the simulated line.

* * * * *